(12) United States Patent
Nascimento et al.

(10) Patent No.: US 7,932,721 B2
(45) Date of Patent: Apr. 26, 2011

(54) INDUCTIVE DECOUPLING OF A RF COIL ARRAY

(75) Inventors: George Nascimento, Rockville, MD (US); Afonso C. Silva, Germantown, MD (US)

(73) Assignee: The United States of America as represented by the Department of Health and Human Services, Washington, DC (US)

(*) Notice: Subject to any disclaimer, the term of this patent is extended or adjusted under 35 U.S.C. 154(b) by 96 days.

(21) Appl. No.: 12/296,417

(22) PCT Filed: Apr. 6, 2007

(86) PCT No.: PCT/US2007/008586
§ 371 (c)(1),
(2), (4) Date: Oct. 7, 2008

(87) PCT Pub. No.: WO2007/117604
PCT Pub. Date: Oct. 18, 2007

(65) Prior Publication Data
US 2009/0289630 A1    Nov. 26, 2009

Related U.S. Application Data

(60) Provisional application No. 60/789,934, filed on Apr. 7, 2006.

(51) Int. Cl.
*G01V 3/00* (2006.01)

(52) U.S. Cl. ........................................ 324/318; 324/309

(58) Field of Classification Search .......... 324/300–322; 600/410–435; 333/219–235; 343/741–752, 343/824, 850–871, 904–908
See application file for complete search history.

(56) References Cited

U.S. PATENT DOCUMENTS

| | | | |
|---|---|---|---|
| 4,093,911 A * | 6/1978 | Hill et al. | 324/322 |
| 4,095,168 A * | 6/1978 | Hlavka | 324/322 |
| 4,703,272 A | 10/1987 | Arakawa | |
| 5,278,505 A | 1/1994 | Arakawa | |
| 5,329,233 A | 7/1994 | Hayes | |
| 5,559,434 A | 9/1996 | Takahashi et al. | |

(Continued)

FOREIGN PATENT DOCUMENTS

JP    4-71534    3/1992

(Continued)

OTHER PUBLICATIONS

Decorps, M. et al., "An Inductively Coupled, Series-Tuned NMR Probe," J. Mag. Res., vol. 65, pp. 100-109 (1985).

(Continued)

*Primary Examiner* — Brij B Shrivastav
*Assistant Examiner* — Dixomara Vargas
(74) *Attorney, Agent, or Firm* — Polsinelli Shughart PC; Teddy C. Scott, Jr.; Paul A. Jenny

(57) ABSTRACT

An apparatus for imaging includes: a radio frequency (RF) coil array having a first RF coil and at least one additional RF coil, where the RF coil array is adapted to generate an image signal; a preamplifier having an input impedance, where the preamplifier is adapted to receive the image signal from the first RF coil; and a transformer to couple the first RF coil to the preamplifier, where impedance of the transformer is adapted to match the input impedance of the preamplifier.

19 Claims, 7 Drawing Sheets

U.S. PATENT DOCUMENTS

| | | | |
|---|---|---|---|
| 5,726,603 A * | 3/1998 | Chawla et al. | 330/269 |
| 5,804,969 A | 9/1998 | Lian | |
| 6,414,488 B1 | 7/2002 | Chmielewski | |
| 6,504,369 B1 | 1/2003 | Varjo et al. | |
| 6,608,480 B1 | 8/2003 | Weyers | |
| 6,639,406 B1 | 10/2003 | Boskamp et al. | |
| 6,727,703 B2 | 4/2004 | Lee | |
| 6,750,652 B2 * | 6/2004 | Weyers et al. | 324/318 |
| 6,822,450 B2 | 11/2004 | Klinge et al. | |
| 6,879,159 B2 | 4/2005 | Yoshida | |
| 6,927,575 B2 | 8/2005 | Burl et al. | |
| 7,068,133 B2 * | 6/2006 | Ries | 335/216 |
| 7,123,090 B2 * | 10/2006 | Ratzel | 330/165 |
| 7,429,339 B2 * | 9/2008 | Renaud et al. | 252/62.54 |
| 2004/0189300 A1 | 9/2004 | Burl et al. | |
| 2005/0174116 A1 | 8/2005 | Leussler et al. | |
| 2005/0245805 A1 | 11/2005 | Hoppel et al. | |

FOREIGN PATENT DOCUMENTS

| | | |
|---|---|---|
| JP | 2002-184208 | 6/2002 |
| WO | WO-2004/038443 A1 | 5/2004 |

OTHER PUBLICATIONS

Gadian, G.D. et al., "Radiofrequency Losses in NMR Experiments on Electrically Conducting Samples," J. Mag. Res., vol. 34, pp. 449-455 (1979).

Hayes, C.E., et al., "Volume Imaging with MR Phased Arrays," Mag. Res. in Med., vol. 18, pp. 309-319 (1991).

Hoult, D.I., "The NMR Receiver: A Description and Analysis of Design," Progress in NMR Spectroscopy, vol. 12, pp. 41-77 (1978).

Hoult, D.I. et al., "The Sensitivity of the Zeugmatographic Experiment Involving Human Samples," J. Mag. Res., vol. 34, pp. 425-433 (1979).

Hoult, D.I. et al., "Use of Mutually Inductive Coupling in Probe Design," Concepts in Magnetic Resonance (Magnetic Resonance Engineering), vol. 5, No. 4, pp. 262-285 (2002).

Ohliger, M.A. et al., "Effects of Inductive Coupling on Parallel MR Image Reconstructions," Mag. Res. in Med., vol. 52, pp. 628-639 (2004).

Nascimento, G.C. et al., "Inductive Decoupling of RF Coil Arrays: A Study at 7T," Abstract ISMRM, May 6, 2006.

Reykowski, A. et al., "Design of Matching Networks for Low Noise Preamplifiers," MRM, vol. 33, pp. 848-852 (1995).

Rivera, M. et al., "MRI Visualization of Small Structures Using Improved Surface Coils," Mag. Res. Imaging, vol. 16, No. 2, pp. 157-166 (1998).

Roemer, P.B. et al., "The NMR Phased Array," Mag. Res. in Med., vol. 16, pp. 192-225 (1990).

* cited by examiner

INDUCTIVE DECOUPLING OF A RF COIL ARRAY

FIELD OF THE INVENTION

This invention generally relates to radio frequency (RF) coil arrays used in magnetic resonance imaging (MRI). Specifically, the invention relates to decoupling the coils in a RF coil array for MRI.

BACKGROUND

The elimination of inductive coupling is an important step for the use of RF coils arrays for MRI, such as in parallel imaging for MRI. For example, in nuclear magnetic resonance (NMR) imaging, if some effective mutual inductance remains among the coils in the coil array, the NMR signal obtained from one coil may disturb the flux in another coil, which may make it difficult to match and tune each circuit with a coil to the input impedance of the respective preamplifier circuit.

A common method to isolate the coils in the coil arrays avoids the build up of significant currents from the NMR signal among each of the coils in the coil array, in such way that the effects from the mutual inductances may be neglected. This may be conventionally achieved by connecting each coil to a circuit that should behave as an open circuit from its input port. A common method employed for this circuit implementation usually involves the use of a network transformer (or an impedance transformer) and preamplifiers with very low input impedance (typically <2Ω) and decoupling networks with lumped elements. However, the construction of low noise figure preamplifiers with extremely low input impedance is not easy to accomplish. In addition, the use of preamplifiers with low input impedance imposes technical restrictions on coil design, especially when considering geometries that require overlapping loops where there is a significant amount of mutual inductance between the RF coils.

In addition, it is known that the coupling of coils to the matching network is usually a hard task to accomplish and is highly dependent on effects caused by sample loading. One such effect is produced by voltage differences in different parts of the coil that generate an electrostatic field around the coil. This electrostatic field may couple to the sample, causing dielectric losses and consequently a reduction of the received signal. Another undesirable effect is caused by standing waves that may be present in the cables that connect the coils to the preamplifier, which may feed back to the pickup coil or may also represent a radiation loss for the NMR signal. Conventionally, these disturbances in the signal-to-noise ratio may be improved by reducing the dielectric losses and also by reducing the currents in the ground loops that may provide resistive and radiation losses.

Another technique employed to decouple RF coils in an array attempts to cancel the flux between any two coils in the array. However, canceling flux is not an efficient method for isolating non-adjacent neighboring coils. Further, canceling flux tends to degrade the NMR signal by inevitable insertion of losses on coils and, moreover, may not work for arbitrary coil geometries.

SUMMARY

One embodiment of the invention includes an apparatus for imaging including: a RF coil array having a first RF coil and at least one additional RF coil, the RF coil array adapted to generate an image signal; a preamplifier having an input impedance, the preamplifier adapted to receive the image signal from the first RF coil; and a first transformer to couple the first RF coil to the preamplifier, impedance of the first transformer to match the input impedance of the preamplifier.

One embodiment of the invention includes a method for imaging, including: obtaining an image with a RF coil array including a first RF coil and at least one additional RF coil, the first RF coil providing an image signal; passing the image signal from the first RF coil through a first transformer to obtain a transformed signal; matching impedance of the first transformer to an input impedance of a preamplifier; and amplifying the transformed signal with the preamplifier.

One embodiment of the invention includes an apparatus for imaging, including: a RF coil array including a plurality of RF coils, the RF coil array adapted to generate an image signal, the RF coils being inductively decoupled from each other; and a plurality of preamplifiers, each preamplifier adapted to receive the image signal from a respective RF coil, a ground for each preamplifier being electrically isolated from a ground for each respective RF coil.

BRIEF DESCRIPTION OF THE DRAWINGS

The foregoing and other features of various embodiments of the invention will be apparent from the following, more particular description of such embodiments of the invention, as illustrated in the accompanying drawings, wherein like reference numbers generally indicate identical, functionally similar, and/or structurally similar elements. The left-most digit in the corresponding reference number indicates the drawing in which an element first appears.

DETAILED DESCRIPTION

Exemplary embodiments of the invention are discussed in detail below. While specific exemplary embodiments are discussed, it should be understood that this is done for illustration purposes only. In describing and illustrating the exemplary embodiments, specific terminology is employed for the sake of clarity. However, the invention is not intended to be limited to the specific terminology so selected. A person skilled in the relevant art will recognize that other components and configurations may be used without parting from the spirit and scope of the invention. It is to be understood that each specific element includes all technical equivalents that operate in a similar manner to accomplish a similar purpose.

Each reference cited herein is incorporated by reference. The examples and embodiments described herein are non-limiting examples.

According to the exemplary embodiments of the invention, the RF coils in a RF coil array of a MRI system are inductively decoupled from each other. Each RF coil is coupled to its respective preamplifier with at least one transformer. A nearly perfect balanced signal is transferred to the preamplifier from the RF coil, and at the same time, the RF coil becomes electrically isolated from the preamplifier and its associated electronics. The electrical isolation may reduce some of the undesired effects of ground loops and parasite signals that typically appear in capacitively-coupled networks. The relationship between the turn ratio for the transformer and the input impedance of the preamplifier determines the decoupling intensity between the RF coils and also the signal-to-noise ratio for the amplified signal output from the preamplifier.

With the invention, the RF coils may be positioned according to different geometrical configurations, such as in a parallel arrangement, an overlapped mode, separated by gaps, or even stacked on top of each other.

With the invention, each preamplifier is connected to a separate receive channel of the MRI system, and the channels may be accessed independently and simultaneously, making it possible to perform parallel imaging acquisitions.

The MRI system may be also used for magnetic resonance spectroscopy (MRS). Other imaging embodiments may further be used with the invention.

Figure 1:
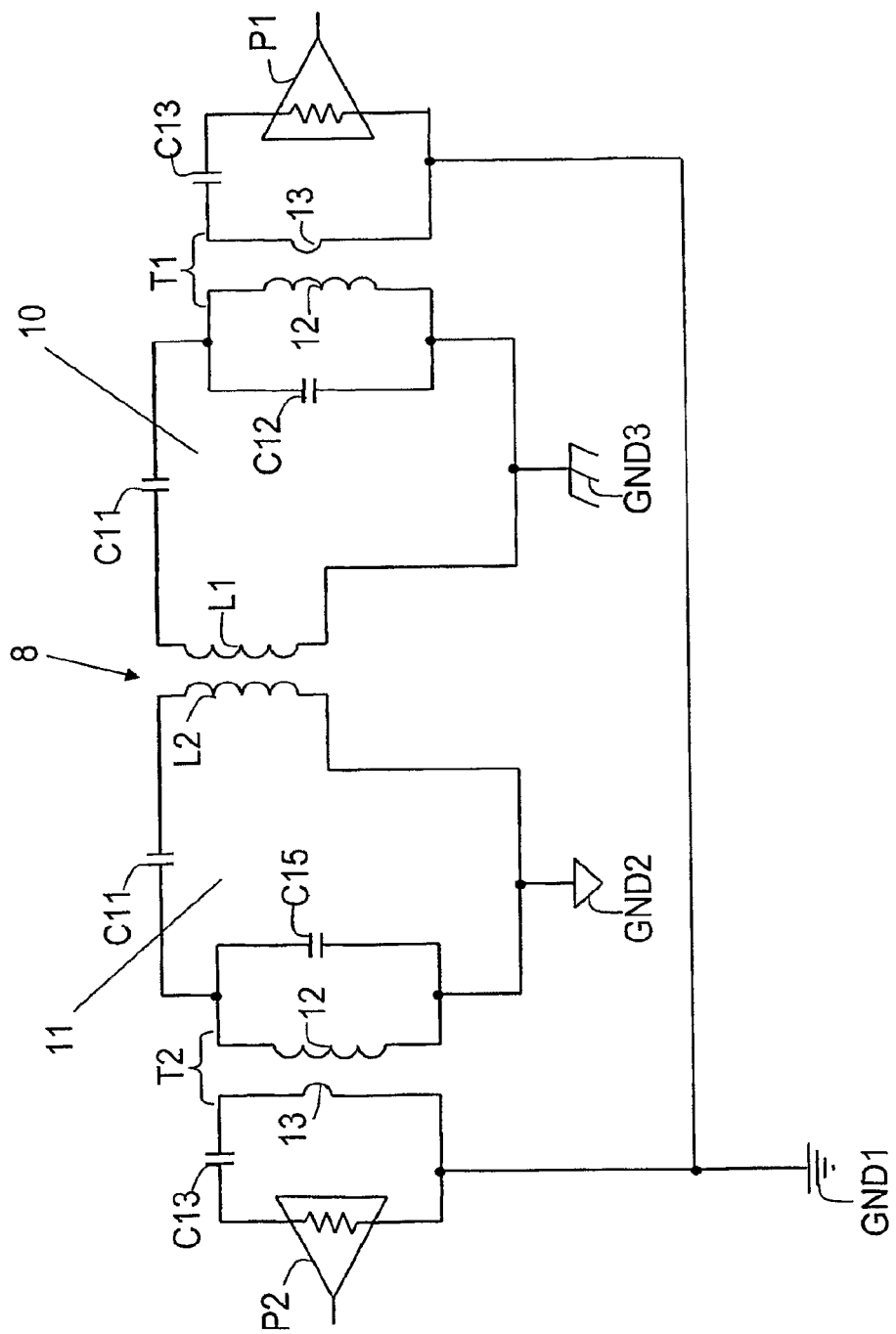
FIG. 1 illustrates a circuit diagram according to an exemplary embodiment of the invention.

FIG. 1 illustrates a circuit diagram according to an exemplary embodiment of the invention. The MRI imaging system includes, for example, an RF coil array having at least two RF coils L1 and L2. The coil array 8 may include additional coils (not shown). Each coil in the coil array is coupled to its own respective preamplifier. Coil L1 is coupled to preamplifier P1, and coil L2 is coupled to preamplifier P2. The two coils L1 and L2 may have different inductances and may have a mutual coupling M.

The network circuit 10 for coil L1 includes a capacitor C12 connected in parallel to a transformer T1. This parallel circuit is connected in series through a capacitor C11 to coil L1. The transformer T1 couples coil L1 to its respective preamplifier P1. The transformer T1 is coupled to coil L1 through its primary coil 12 and to the preamplifier P1 through its secondary coil 13. The secondary coil 13 of transformer T1 is connected in series through a capacitor C13 to the preamplifier P1, which has an input impedance of Zp1. The primary and secondary coils 12, 13 of transformer T1 may have a turn ratio of n:1, where n is greater than 0, including fractional numbers. Through the capacitor C13, the impedance of the secondary coil 13 of transformer T1 matches the input impedance Zp1 of the preamplifier P1. The transformer T1 has a coupling coefficient K1. The network circuit 11 for coil L2 is similar to the network circuit 10 for coil L1 and couples coil 12 to the preamplifier P2 via the transformer T2. The impedance of the secondary coil 13 of the transformer T2 matches the impedance of the preamplifier P2. The ground GND3 of circuit 10 is electrically isolated from the ground GND2 of circuit 11 and from the ground GND1 of the preamplifier P1. The preamplifiers P1 and P2 are connected to the ground GND1.

The turn ratio of transformers T1 and T2 may be selected to minimize noise for the preamplifiers P1 and P2, respectively. A number of winding in the primary coil of the transformer may be equal to, greater than, or fewer than a number of windings in the ns secondary coil of the transformer. Further, the isolation limits for coils L1 and L2 in coil array 8 may be enhanced by using high input impedance for the preamplifiers P1 and P2, respectively.

The transformers T1 and T2 are passive transformers. The transformer T1, T2 may include helical windings, solenoidal windings, or stripline baluns. The transformer T1, T2 may include an electrostatic shield comprised of a conducting material. The transformer T1, T2 may utilize superconducting materials.

The signal that reaches the preamplifier P1 is coupled inductively to coil L1 through the primary coil of the transformer T1. Because the primary and secondary coils of the transformer T1 are isolated, the preamplifier circuit (and the MRI scanner electronics connected thereto (not shown)) are electrically isolated from coil L1. This arrangement provides an electrical balance and isolation between the channels of the coil array. With the Invention, traps and baluns in the circuits 10 and 11, a used conventionally, may be unnecessary. Further, the inductively coupled inventive technique employs a transformer to match each coil in the coil array to its respective preamplifier. The inventive technique provides a balanced structure that may reduce dielectric losses and may isolate the lossy currents in ground loops.

Referring to the exemplary circuit diagram of FIG. 1, it may be shown that the impedance of the circuit 10 as seen from the circuit 11, may be given as:

$$Z = R_2 + \frac{\omega^2 \cdot M^2 \cdot L^2}{R_1 + \frac{n^2 \cdot Z_{p1}}{K_1^2}}. \qquad (1)$$

where ω is the NMR Larmor frequency, M is the inductive coupling between L1 and L2, L is the inductance of coil L2, R1 is the resistance of coil L1, R2 is the resistance of coil L2, K1 is the coupling coefficient for the transformer T1, n is from the turn ratio n:1 between the primary and secondary coils 12, 13 of the transformer T1, and Zp1 is the input impedance of the preamplifier P1. In order to achieve high isolation between coils L1 and L2, Z should be made as close as possible to R2. Thus, the second term in equation (1) should be made as negligible as possible. This can be accomplished if both n and Zp1 are chosen to be high.

The exemplary embodiment, described above with reference to FIG. 1, was tested in a 7 T/30 cm Bruker Avance MRI system. A four-coil array for imaging a rat brain was built using the circuit described with reference to FIG. 1. A positive-intrinsic-negative (PIN) diode circuitry (not shown in the circuit of FIG. 1) was incorporated to allow decoupling of the coil array from the transmit coil. The coil array was connected to regular 50 Ω input impedance preamplifiers. The transformers were made very small with a 7:1 turn ratio between the primary coil and the secondary coil. No trap or baluns were employed in the circuit array. The isolation level for this configuration is described by equation (1), and this is equivalent to the isolation achieved when using low input impedance preamplifiers, with, for example, 1Ω input impedance.

Figure 5B:
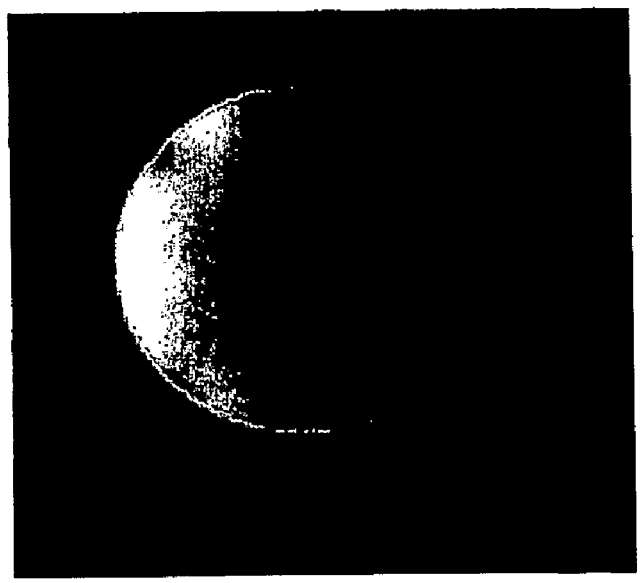
FIG. 5B shows the sum of squares reconstruction for the images of FIG. 5A.
Figure 5A:
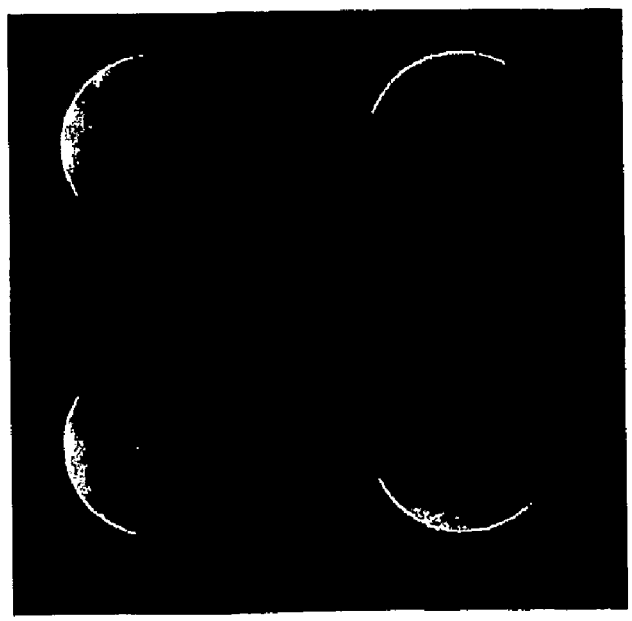
FIG. 5A shows individual fast low-angle shot (FLASH) images of coils in an exemplary four coil array.
Figures 6A, 6B, 6C:
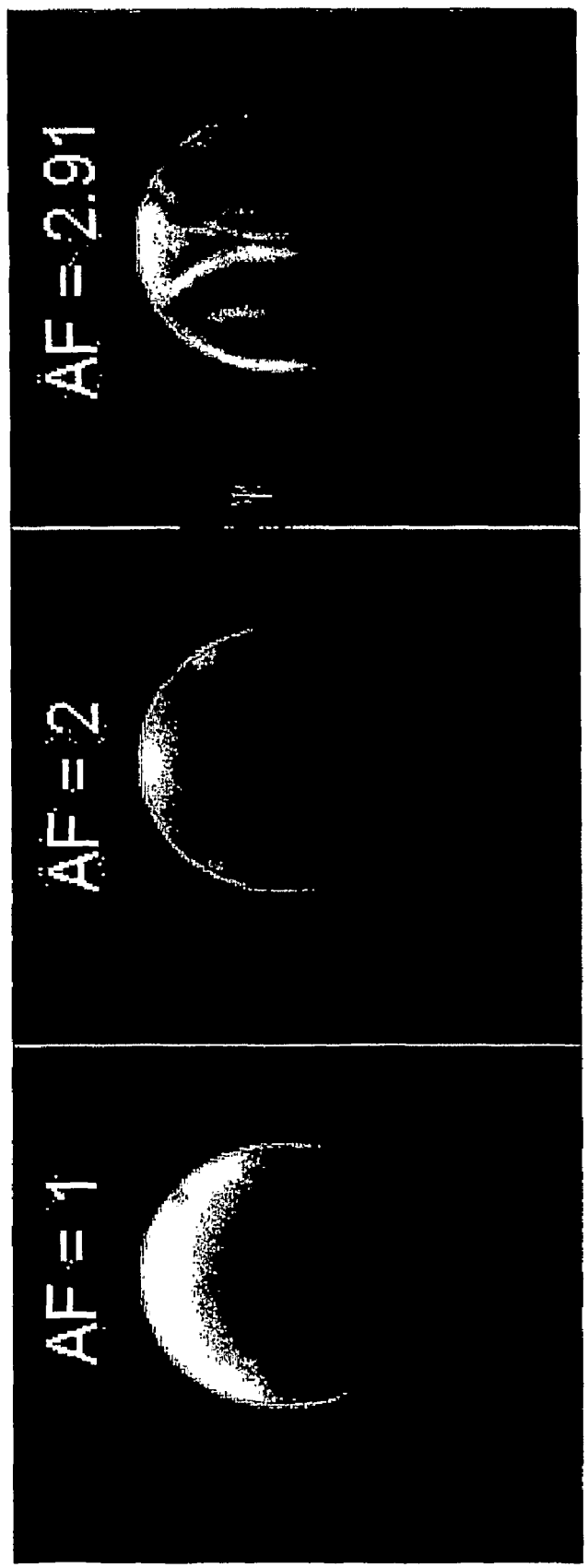
FIGS. 6A, 6B, and 6C show images acquired with generalized autocalibrating partially parallel acquisition (GRAPPA) reconstruction at different acceleration factors for the exemplary four coil array.

The measured isolation between the channels in the test was better than 45 dB. FIG. 5A shows individual FLASH axial images obtained with each coil, and FIG. 5B shows a combined image obtained using a sum of squares reconstruction from the four images shown in FIG. 5A. As can be seen by comparing the individual images in FIG. 5A to the combined image in FIG. 5B, no significant coupling is observed between the RF coils. FIGS. 6A, 6B, and 6C show FLASH images acquired with the GRAPPA acquisition scheme at three different acceleration factors (AF), 1, 2, and 2.91, respectively. Reconstruction artifacts are only noticeable for AF=2.91 in FIG. 6C in the form of aliasing banding along the phase encoding directions. The inductive decoupling between the different channels shows good performance with excellent isolation of all four channels and immunity to standing waves or other parasitic signals.

Figure 2A:
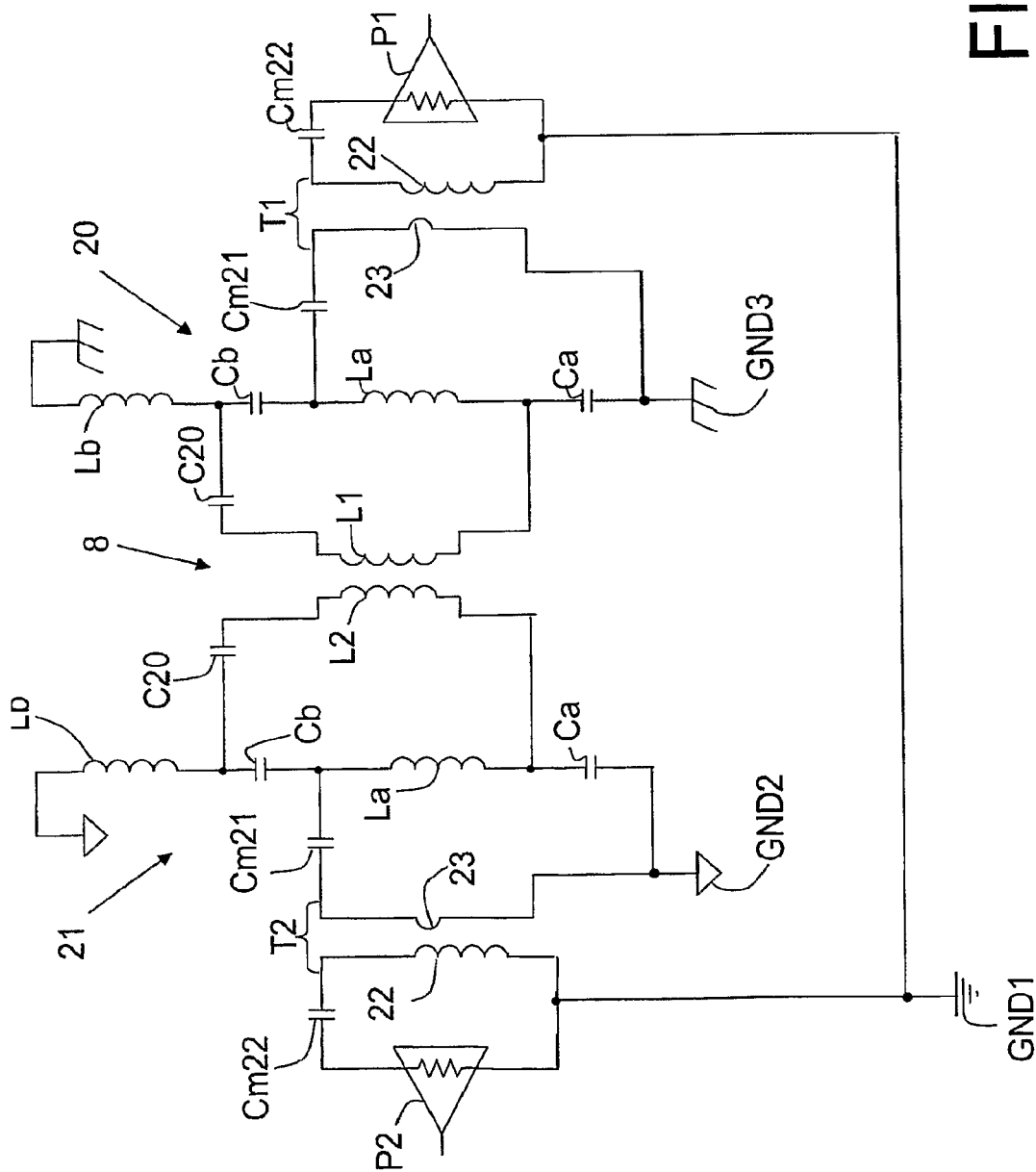
FIG. 2A illustrates a circuit diagram according to an exemplary embodiment of the invention.

FIG. 2A illustrates a circuit diagram according to an exemplary embodiment of the invention. The circuit diagram of FIG. 2A depicts another technique to inductively decouple the coils L1 and L2, as discussed above for the exemplary embodiment of FIG. 1. The circuit diagram in FIG. 2A depicts network circuit 20, for example, a balun circuit, for coupling the coil L1 to the preamplifier P1 via the transformer T1 and depicts network circuit 21, for example, a balun circuit, for coupling the coil L2 to the preamplifier P2 via the transformer T2. The balun circuit 20 for coil L1 includes a capacitor C20, capacitors Ca and Cb, inductors La and Lb, a capacitor Cm21, and the transformer T1. The balun circuit 20 converts the low impedance of the transformer T1 into a high impedance for the coil L1. The capacitor Cm22 matches impedance of the transformer T1 to the input impedance Zp1 of the preamplifier P1 via the secondary coil 22 of transformer T1. The circuit 21 for coil L2 is similar to the circuit 20 for coil L1 and matches impedance of the coil L2 to the impedance of the preamplifier P2. The ground GND3 of circuit 20 is electrically isolated from the ground GND2 of circuit 21 and from the ground GND1 of the preamplifier P1.

Referring to an exemplary circuit diagram of FIG. 2A, it may be shown that the impedance of circuit 20 as seen from the resistive impedance of L1 is given by:

$$Z = n^2 \cdot \frac{1}{Z_{p1}} \cdot \frac{L}{C} \qquad (2)$$

where n is the turn ratio between the secondary and the primary coils of the transformer T1, Zp1 is the impedance of the preamplifier P1, L is the value for the inductances La or Lb (La=Lb=L), C is the value for the capacitor Ca or Cb (Ca=Cb=C). Equation (2) assumes that the primary and secondary resistances of the transformer T1 are negligible and also that the coupling coefficient K1 for the transformer T1 is 1. For best decoupling of the coils L1 and L2, the impedance load in circuit 20 as seen from coil L1 should be high, i.e., Zp1 should be made as large as possible. According to equation (2), the presence of the transformer T1 in circuit 20 enhances the impedance seen from coil L1 by a factor of $n^2$.

Figure 2B:
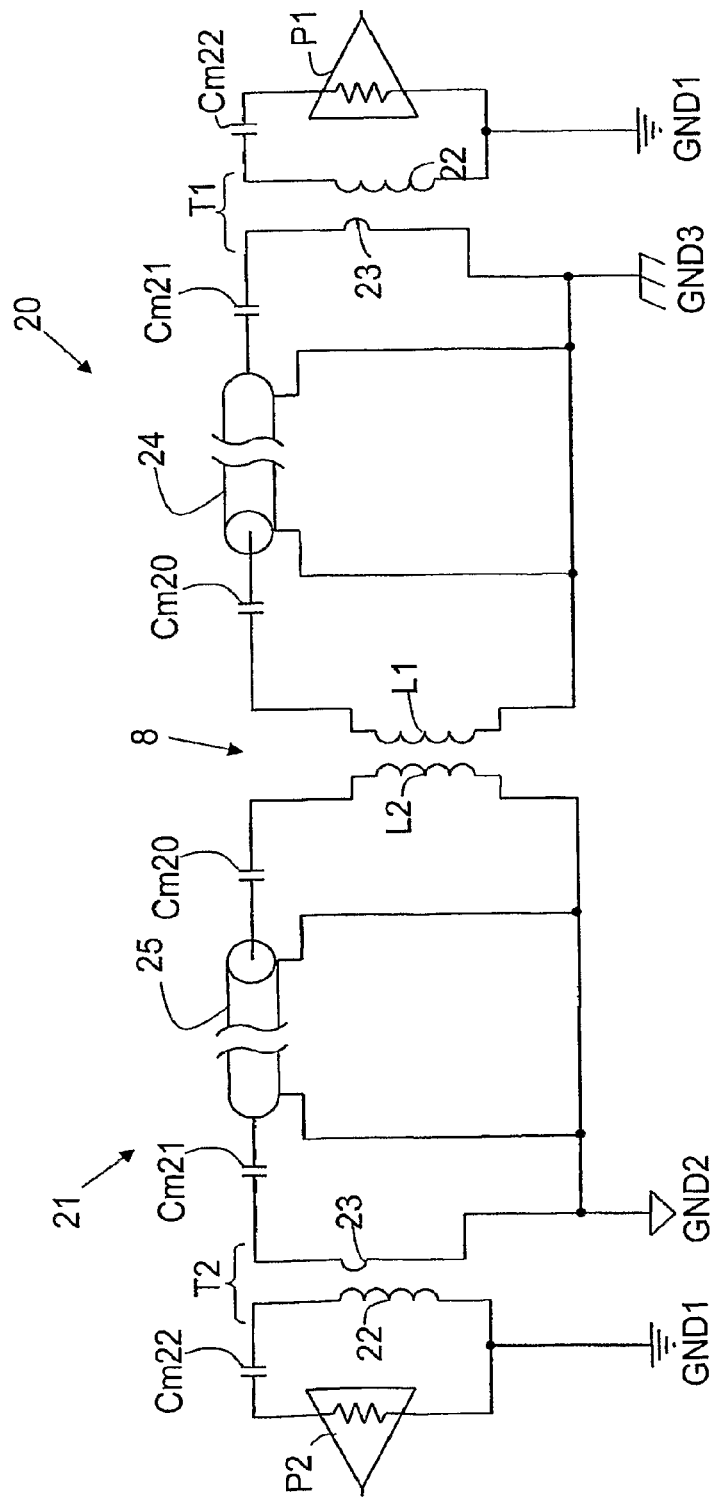
FIG. 2B illustrates a circuit diagram according to an exemplary embodiment of the invention.

With reference to FIG. 2B, this exemplary embodiment is similar to an exemplary embodiment of FIG. 2A except that each balun circuit 20, 21 in FIG. 2A is replaced by a coaxial cable 24, 25 with a length substantially equal to one fourth of a wavelength at the frequency of operation. The coaxial cable 24 converts the low impedance of the transformer T1 into a high impedance for the coil L1. Of course, it is contemplated that the coaxial cable 24, 25 may be replaced with an equivalent circuit representing an equivalent of one fourth of a wavelength at the frequency of operation.

The capacitor Cm22 matches impedance of the transformer T1 to the input impedance Zp1 of the preamplifier P1 via the secondary coil 22 of transformer T1. The coaxial cable is connected at each end in series with the capacitors Cm20, Cm21. The capacitors Cm20, Cm21 may be length compensation capacitors that are configured to cancel at least some of the phase shift in the coaxial cable. The values of the capacitors Cm20, Cm21 may be selected based upon the length of the coaxial cable and the desired operating characteristics. The coaxial cable has shown better effective signal transmission than the balun circuit of an exemplary embodiment of FIG. 2A.

Figure 3:
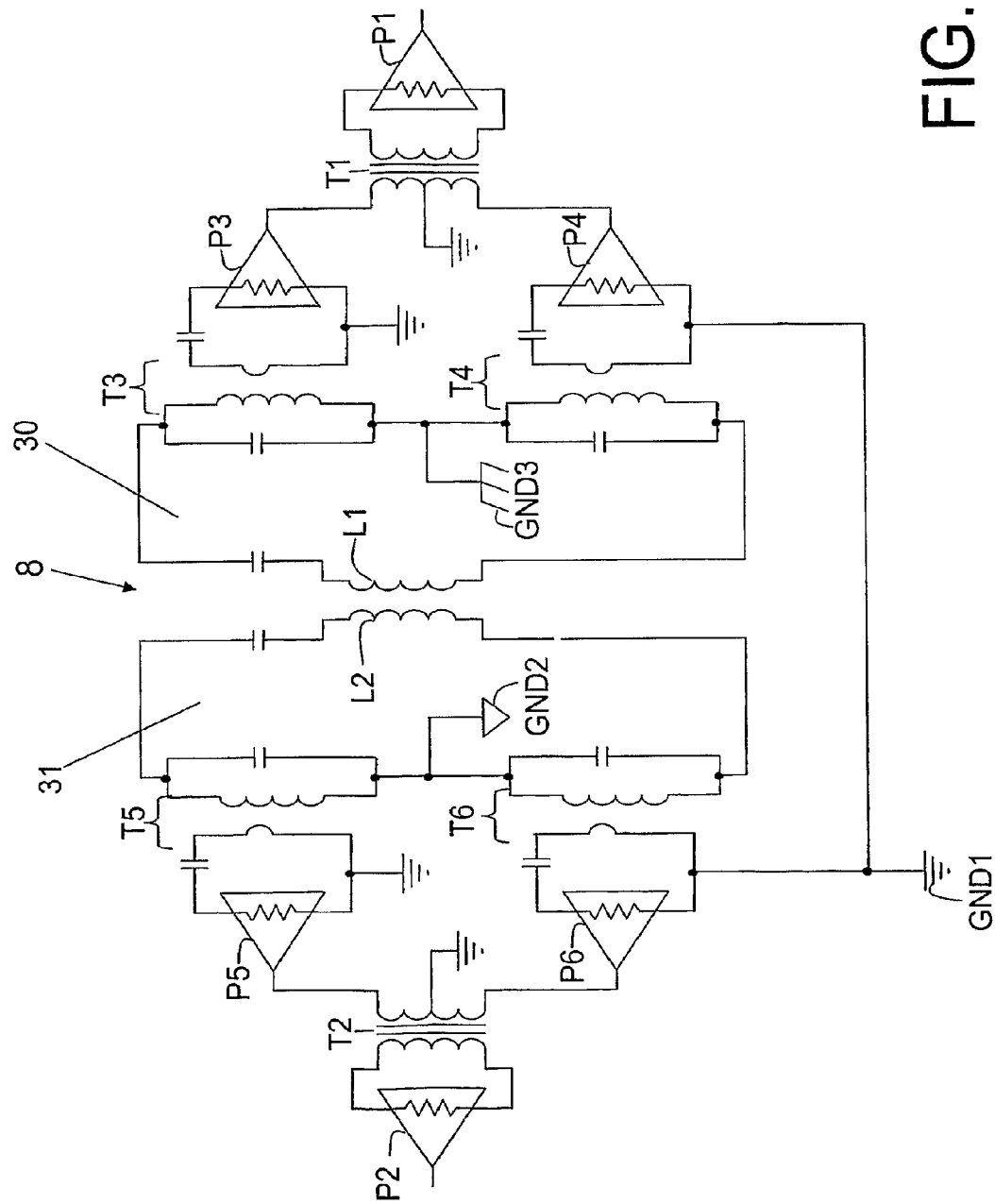
FIG. 3 illustrates a circuit diagram according to an exemplary embodiment of the invention.

FIG. 3 illustrates a circuit diagram according to an exemplary embodiment of the invention. The circuit diagram of FIG. 3 depicts another technique to inductively decouple the coils L1 and L2, as discussed above for the exemplary embodiment of FIG. 1. The circuit diagram in FIG. 3 depicts network circuit 30, which differs from network circuit 10 in FIG. 1, for coupling the coil L1 to the preamplifier P1 via the transformers T1, T3, and T4 and depicts network circuit 31, which differs from network circuit 11 in FIG. 1, for coupling the coil L2 to the preamplifier P2 via the transformers T2, T5, and T6. In circuit 30, the detected signal in the coil L1 is distributed in a balanced configuration to transformers T3 and T4 at the same time. The outputs from the transformers T3 and T4 are amplified in preamplifiers P3 and P4, respectively, and combined in transformer T1. Impedance of the transformer T1 is matched to impedance of the MRI receiver chain, e.g. the input impedance of the preamplifier P1. Since noise signals coming from preamplifiers P3 and P4 are not correlated, the combination of signals may provide better signal-to-noise ratio as compared to the circuit that uses just one preamplifier as shown in FIG. 1. The circuit 31 for coil L2 is similar to the circuit 30 for coil L1. The ground GND3 of circuit 30 is electrically isolated from the ground GND2 of circuit 31 and from the ground GND1 of the preamplifier P1. The uncoupling between coils L1 and L2 for this exemplary embodiment is twice as effective as the uncoupling between the coils L1 and L2 for the exemplary embodiment of FIG. 1.

Figure 4:
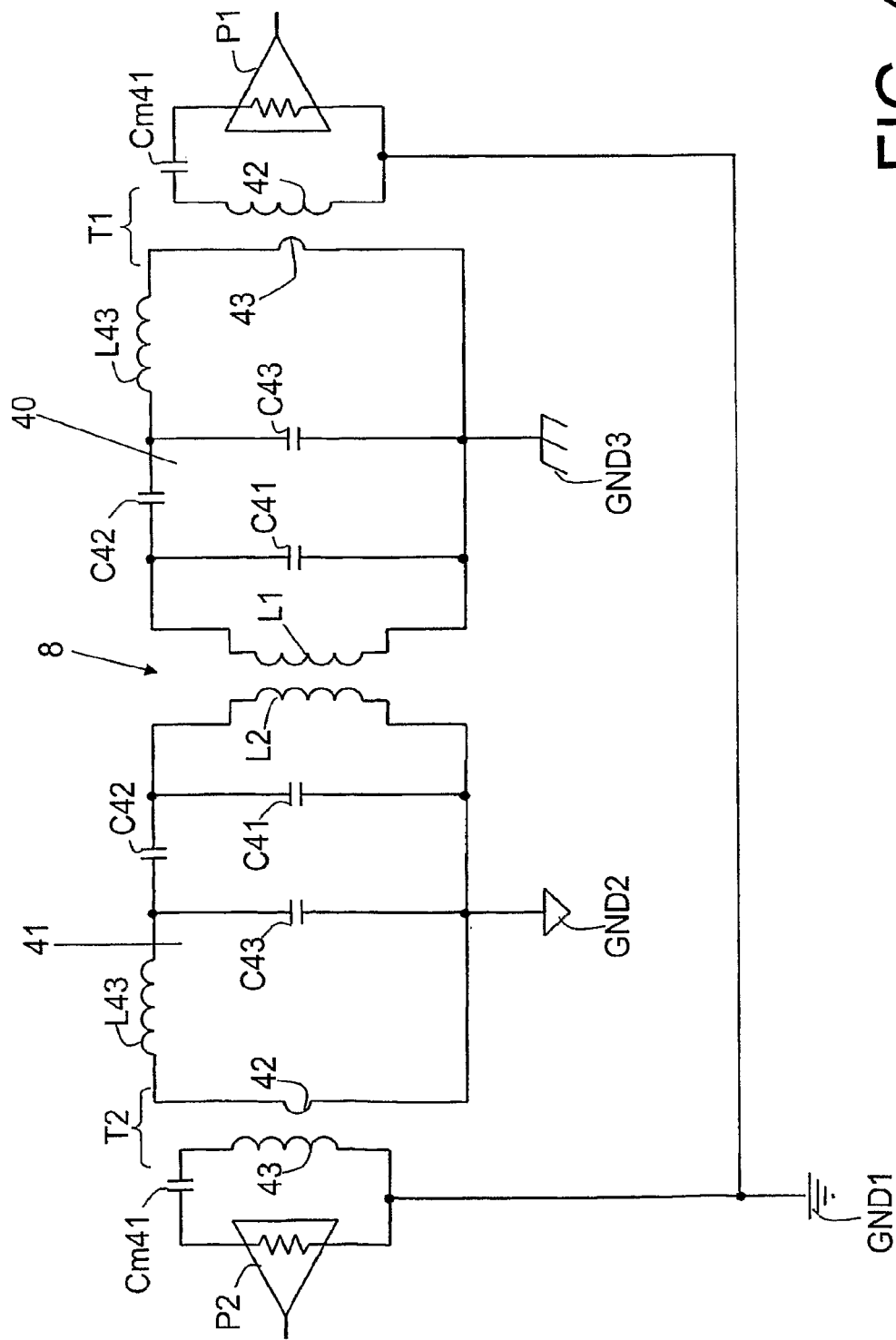
FIG. 4 illustrates a circuit diagram according to an exemplary embodiment of the invention.

FIG. 4 illustrates a circuit diagram according to an exemplary embodiment of the invention. The circuit diagram of FIG. 4 depicts another technique to inductively decouple the coils L1 and L2, as discussed above for the exemplary embodiment of FIG. 1. The circuit diagram in FIG. 4 depicts network circuit 40, which differs from network circuit 10 in FIG. 1, for coupling the coil L1 to the preamplifier P1 via the transformer T1 and depicts network circuit 41, which differs from network circuit 11 in FIG. 1, for coupling the coil L2 to the preamplifier P2 via the transformer 12. The circuit 40 includes capacitors C41, C42 and C43, an inductor L43, and the transformer T1. Through the capacitor Cm41, the impedance of the secondary coil 42 of transformer T1 matches the input impedance Zp1 of the preamplifier P1. The circuit 41 for coil L2 is similar to the circuit 40 for coil L1. The ground GND3 of circuit 40 is electrically isolated from the ground GND2 of circuit 41 and from the ground GND1 of the preamplifier P1.

To achieve high levels of decoupling between the coils L1 and L2, the circuits 40 and 41 require low input impedance for the preamplifiers P1 and P2, respectively. The transformers T1 and T2 can be used to lower the equivalent input impedance of the preamplifiers P1 and P2, respectively. For circuit 40 (and similarly for circuit 41), it may be shown that the equivalent input impedance Zin of the preamplifier P1 measured on the primary coil 43 of transformer T1 is given by:

$$Z_{in} = \frac{Z_{p1}}{n^2} \qquad (3)$$

where Zp1 is the input impedance of the preamplifier P1, and n is the turn ratio between the secondary and the primary coils 42, 43 of the transformer T1. According to equation (3), the transformer T1 lowers the equivalent input impedance Zin of the preamplifier P1 by a factor of $n^2$.

The invention is described in detail with respect to exemplary embodiments, and it will now be apparent from the foregoing to those skilled in the art that changes and modifications may be made without departing from the invention in its broader aspects, and the invention, therefore, as defined in the claims is intended to cover all such changes and modifications as fall within the true spirit of the invention.

The invention claimed is:

1. An apparatus for imaging, comprising:
    a radio frequency (RF) coil array comprising a first RF coil and at least one additional RF coil, the RF coil array adapted to generate an image signal, wherein the first RF coil is inductively decoupled from the at least one additional RF coil;
    a preamplifier having an input impedance, the preamplifier adapted to receive the image signal from the first RF coil;
    another preamplifier having another input impedance, the other preamplifier adapted to receive the image signal from the at least one additional RF coil;
    a first transformer to couple the first RF coil to the preamplifier, impedance of the first transformer to match the input impedance of the preamplifier and
    a second transformer to couple the at least one additional RF coil to the other preamplifier, impedance of the second transformer to match the input impedance of the other preamplifier.

2. The apparatus of claim 1, wherein the first transformer comprises a primary coil coupled to the first RF coil and a secondary coil coupled to the preamplifier.

3. The apparatus of claim 2, wherein a number of windings for the primary coil of the transformer is one of greater than, fewer than, or equal to a number of windings for the secondary coil of the transformer.

4. The apparatus of claim 1, wherein the first transformer comprises at least one of helical windings, solenoidal windings, or stripline baluns.

5. The apparatus of claim 1, wherein the first transformer is a passive transformer.

6. The apparatus of claim 1, wherein the first transformer comprises an electrostatic shield comprising a conducting material.

7. The apparatus of claim 1, wherein the first transformer comprises a superconducting material.

8. The apparatus of claim 1, wherein a ground of the first RF coil is electrically isolated from a ground of the preamplifier.

9. The apparatus of claim 1, wherein a ground of the first RF coil is electrically isolated from grounds of the additional RF coils in the RF coil array.

10. The apparatus of claim 1, wherein the apparatus is adapted for magnetic resonance imaging or magnetic resonance spectroscopy.

11. The apparatus of claim 1, further comprising:
    a balun circuit to couple the first RF coil to the first transformer.

12. The apparatus of claim 1, further comprising:
    a coaxial cable with a length equal to one fourth of a wavelength at a frequency of an operation of the first RF coil, to couple the first RF coil to the first transformer.

13. A method for imaging, comprising:
    obtaining an image with a radio frequency (RF) coil array comprising a first RF coil and at least one additional RF coil, the first RF coil providing an image signal, wherein the first RF coil is inductively decoupled from the at least one additional RF coil;
    passing the image signal from the first RF coil through a first transformer to obtain a first transformed signal;
    passing the image signal from the first RF coil through a first transformer to obtain a second transformed signal
    matching impedance of the first transformer to an input impedance of a first preamplifier;
    amplifying the transformed signal with the first preamplifier;
    matching another impedance of the first transformer to an input impedance of a second preamplifier; and
    amplifying the transformed signal with the second preamplifier.

14. The method of claim 13, wherein the first transformer comprises primary and secondary coils and further comprising:
    coupling the primary coil to the first RF coil; and
    coupling the secondary coil to the preamplifier.

15. The method of claim 13, further comprising:
    coupling the first RF coil to the first transformer via second and third transformers.

16. The method of claim 13, further comprising:
    coupling the first RF coil to the first transformer via a balun circuit.

17. The method of claim 13, further comprising:
    coupling the first RF coil to the first transformer via a coaxial cable with a length equal to one fourth of a wavelength at a frequency of an operation of the first RF coil.

18. An apparatus for imaging, comprising:
    a radio frequency (RF) coil array comprising a plurality of RF coils, the RF coil array adapted to generate an image signal, the RF coils being inductively decoupled from each other;
    a plurality of preamplifiers, each preamplifier adapted to receive the image signal from a respective RF coil, a ground for each preamplifier being electrically isolated from a ground for each respective RF coil; and
    a plurality of transformers, each transformer to couple a different one of the RF coils to a respective preamplifier so that impedance of each transformer matches an input impedance of the respective preamplifier.

19. An apparatus for imaging, comprising:
    a radio frequency (RF) coil array comprising a plurality of RF coils, the RF coil array adapted to generate an image signal, the RF coils being inductively decoupled from each other;
    a plurality of preamplifiers, each preamplifier adapted to receive the image signal from a respective RF coil, a ground for each preamplifier being electrically isolated from a ground for each respective RF coil; and
    a plurality of groups of transformers, each group of transformers to couple one of the RF coils to a respective preamplifier so that an impedance of each group of transformers matches an input impedance of the respective preamplifier.

* * * * *